United States Patent
Karve et al.

(10) Patent No.: US 10,361,127 B1
(45) Date of Patent: Jul. 23, 2019

(54) VERTICAL TRANSPORT FET WITH TWO OR MORE GATE LENGTHS

(71) Applicant: INTERNATIONAL BUSINESS MACHINES CORPORATION, Armonk, NY (US)

(72) Inventors: Gauri Karve, Cohoes, NY (US); Fee Li Lie, Albany, NY (US); Indira Seshadri, Niskayuna, NY (US); Mona Ebrish, Albany, NY (US); Leigh Anne H. Clevenger, Rhinebeck, NY (US); Ekmini A. De Silva, Slingerlands, NY (US); Nicole A. Saulnier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/856,533

(22) Filed: Dec. 28, 2017

(51) Int. Cl.
| | |
|---|---|
| *H01L 21/8234* | (2006.01) |
| *H01L 21/3213* | (2006.01) |
| *H01L 21/027* | (2006.01) |
| *H01L 21/265* | (2006.01) |
| *H01L 27/088* | (2006.01) |
| *H01L 27/02* | (2006.01) |
| *H01L 29/08* | (2006.01) |
| *H01L 29/10* | (2006.01) |
| *H01L 29/78* | (2006.01) |

(Continued)

(52) U.S. Cl.
CPC .. *H01L 21/823456* (2013.01); *H01L 21/0273* (2013.01); *H01L 21/26513* (2013.01); *H01L 21/32139* (2013.01); *H01L 21/823418* (2013.01); *H01L 21/823487* (2013.01); *H01L 27/0207* (2013.01); *H01L 27/088* (2013.01); *H01L 29/0847* (2013.01); *H01L 29/1037* (2013.01); *H01L 29/7827* (2013.01); *H01L 21/3065* (2013.01); *H01L 21/3081* (2013.01)

(58) Field of Classification Search
CPC ........... H01L 29/0847; H01L 29/42372; H01L 29/66666; H01L 29/7827; H01L 29/78618; H01L 29/78642; H01L 29/78696; H01L 21/823456; H01L 21/0273; H01L 21/26513; H01L 21/32139; H01L 21/823418; H01L 21/823487; H01L 27/0207; H01L 27/088; H01L 29/1037; H01L 21/3065; H01L 21/3081
See application file for complete search history.

(56) References Cited

U.S. PATENT DOCUMENTS

| | | |
|---|---|---|
| 6,355,399 B1 | 3/2002 | Sajan et al. |
| 6,406,962 B1 | 6/2002 | Agnello et al. |
| (Continued) | | |

OTHER PUBLICATIONS

Lin "100-Ghz Transistors from Wafer-Scale Epitaxial Graphene", Science, Feb. 5, 2019, vol. 327, Issue 5966, pp. 662.

*Primary Examiner* — Mohammed Shamsuzzaman
(74) *Attorney, Agent, or Firm* — Tutunjian & Bitetto, P.C.; Vazken Alexanian

(57) ABSTRACT

A method for forming a device with multiple gate lengths includes forming a gate stack on vertical fins. A cutting mask formed on the gate stack is etched to include two or more different heights. Gate structures with two or more gate lengths are etched by employing the two or more different heights in the cutting mask as an etch mask. The cutting mask is removed. A top source/drain regions is formed on top of the vertical fins.

13 Claims, 16 Drawing Sheets

(51) Int. Cl.
*H01L 21/308* (2006.01)
*H01L 21/3065* (2006.01)

(56) References Cited

U.S. PATENT DOCUMENTS

| | | |
|---|---|---|
| 6,617,085 B1 | 9/2003 | Kanh et al. |
| 6,828,634 B2 | 12/2004 | Oshima |
| 6,870,189 B1 | 3/2005 | Harada et al. |
| 9,287,413 B2 | 3/2016 | Chen et al. |
| 9,356,020 B2 | 5/2016 | Colinge et al. |
| 9,418,994 B1* | 8/2016 | Chao .................. H01L 27/0886 |
| 9,627,531 B1 | 4/2017 | Chiang et al. |
| 9,691,868 B2 | 6/2017 | Song et al. |
| 9,773,708 B1* | 9/2017 | Zhang ............. H01L 21/823828 |
| 9,837,553 B1* | 12/2017 | Wu .................. H01L 29/78696 |
| 2006/0197228 A1 | 9/2006 | Daubenspeck et al. |
| 2012/0052640 A1* | 3/2012 | Fischer ........... H01L 21/823425 |
| | | 438/268 |
| 2012/0171822 A1* | 7/2012 | Yuan .................. H01L 21/0274 |
| | | 438/166 |

* cited by examiner

VERTICAL TRANSPORT FET WITH TWO OR MORE GATE LENGTHS

BACKGROUND

Technical Field

The present invention generally relates to semiconductor processing, and more particularly to methods and structures for integrating vertical transport field effect transistors (VT-FETs) with two or more gate lengths on the same chip.

Description of the Related Art

Vertical field effect transistors (VFETs) can be a viable device option for complementary metal oxide semiconductor (CMOS) technology, especially beyond 7 nm node. To be useful VFET designs will need greater scalability to provide transistors with greater flexibility with changing dimensions.

SUMMARY

In accordance with an embodiment of the present invention, a method for forming a device with multiple gate lengths includes forming a gate stack on vertical fins. A cutting mask formed on the gate stack is etched to include two or more different heights. Gate structures with two or more gate lengths are etched by employing the two or more different heights in the cutting mask as an etch mask. The cutting mask is removed. A top source/drain region is formed on top of the vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
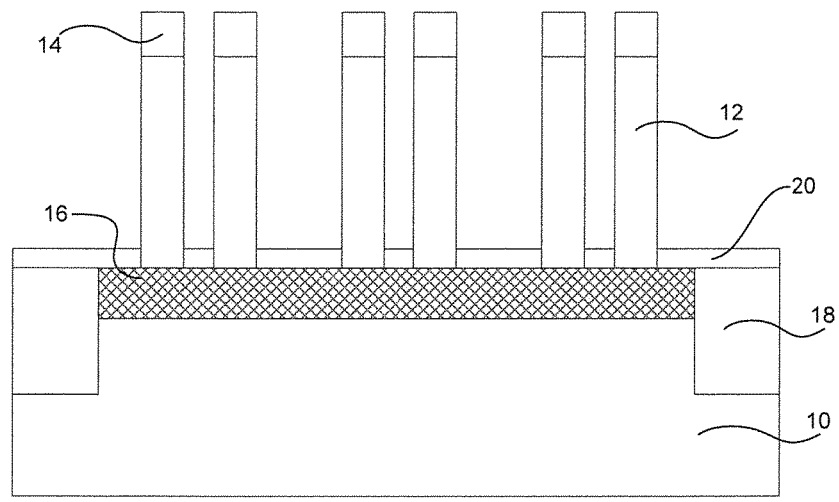
FIG. 1 is a cross-sectional view showing a semiconductor device having multiple sets of fins with a hard mask cap on a substrate with a bottom spacer and a bottom source/drain region next to a shallow trench isolation (STI) region in accordance with an embodiment of the present invention.

Vertical transport field effect transistors (VTFETs) with multiple gate lengths on the same chip are a challenge to manufacture. VFETS and VTFETS will be interchangeable hereinafter. Multiple depth gate recessing includes loading effects and is non-uniform when done directly on gate stacks or through block masks for each gate length. Additionally, providing equal top source/drain spacing and volume for each gate length for low parasitic resistance can be a challenge.

Multiple gate lengths can be provided in accordance with aspects of the present invention. In one useful embodiment, using a resist mask over a cutting mask, e.g., an organic planarization layer (OPL), allows for multiple gate lengths to be formed in one etching process. The resist mask over the OPL can be exposed in a number of methods. One method employs a mask to form two gate lengths, with the mask stopping light from the lithography process from passing through the areas with the mask present. Another method uses a grey tone mask that allows different percentages of light to pass through the mask during the lithography process. These percentages permit for more than a binary mask and result (passing all light versus no light). The grey tone mask permits for multiple gate lengths by having multiple areas that allow different percentages of light to pass through the mask during the lithography process. For example, the grey tone mask can permit about 0% and about 100% of the lithography light to pass through the mask in different regions, but there can also be regions that permit about 30% and about 60% of the light to pass through. The grey tone masks permits varying gradients of light to pass through the mask enabling multiple different regions under the grey tone mask to each receive from 0% to 100% of the light of the lithography process.

With the different percentage of light from the lithography process etching to different depths based on the percentage of light passage through the masks, the mask can form two gate lengths and the grey tone mask can produce two or more gate lengths. The grey tone mask is not limited to four different percentages. The same masks employed to etch the different gate lengths can be employed in, e.g., the ion implantation process to create variable implant depths for the different gate lengths to compensate for a top source/drain volume difference.

The masks employed permit gates with different gate lengths to be adjacent to each other. In one embodiment, the gates can be in a row with the gates having two gate lengths with every other gate alternating between the two gate lengths, e.g, tall gate length, short gate length, tall gate length, etc. In another embodiment, the gates can be clustered together based on gate length to form a checkerboard patterns, with each "square" of the checkboard having a different gate length.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated semiconductor device is shown in accordance with one embodiment. The device includes a substrate 10 having multiple layers formed thereon. The substrate 10 can include any suitable substrate structure, e.g., a bulk semiconductor, a semiconductor-on-insulator (SOI) substrate, etc. In one example, the substrate 10 can include a silicon-containing material. Illustrative examples of Si-containing materials suitable for the substrate 10 can include, but are not limited to, Si, SiGe, SiGeC, SiC and/or multi-layers thereof. Although silicon is the predominantly used semiconductor material in wafer fabrication, alternative semiconductor materials can be employed as well, such as, but not limited to, germanium, gallium arsenide, gallium nitride, silicon germanium, cadmium telluride, zinc selenide, etc. In other embodiments, the substrate 10 can include multiple layers of the same or different semiconductor materials.

In one or more embodiments, a photo mask layer (not shown) may be formed on the exposed surface of the substrate 10. In various embodiments, the photomask layer may be a temporary resist (e.g., PMMA) that may be deposited on the substrate or on a hard mask layer (not shown), patterned, and developed. The photomask layer may be a positive resist or a negative resist.

The photomask layer may be patterned and developed to form photomask blocks covering at least a portion of the surface of the substrate 10 or a hard mask cap 14. The photomask blocks protect the covered portions of the substrate 10 or the hard mask cap 14, while exposed portions of the substrate 10 are etched to form fins 12 in the substrate 10. One or more photomask blocks may define the width, length, and pitch of one or more vertical fins. The hard mask cap 14 can include a nitride dielectric materials, such as, e.g., SiN.

The substrate 10 is etched using the hard mask cap 14 to form the fins 12. A reactive ion etch (RIE) is performed to etch the fins 12 into the substrate 10. The photomask, if present, can be removed during (consumed) or after the RIE. The photomask can be removed by known stripping methods.

Vertical fins 12 can be formed from the substrate 10 by etching the substrate 10 between portions of the hard mask cap 14. The substrate 10 can be etched by the RIE to provide a directional etch with control of sidewall etching. In various embodiments, the substrate 10 may be etched using, e.g., a dry plasma etch. It should be understood that other methods are contemplated for the formation of the fins 12 on the substrate 10. Such methods can include growing the fins, employing other patterning techniques, etc. Alternatively, other patterning techniques such as sidewall image transfer (SIT), self-aligned double patterning (SADP), self-aligned quadruple patterning (SAQP) can be used to form the fins 12.

A bottom source/drain (S/D) region 16 is formed below the fins 12. There are a plurality of methods to form the bottom S/D region 16. For example, implantation may be employed or in-situ doped epitaxy can be performed at this point or even before fin formation. The bottom S/D region 16 can be formed below the vertical fin(s) 12 by ion implantation, diffusion using a diffusion layer with and anneal, in-situ doped epitaxy, gas phase doping, plasma doping, plasma immersion ion implantation, cluster doping, infusion doping, liquid phase doping, solid phase doping, etc. In any event, the bottom S/D region 16 can be annealed to form a source/drain. In various embodiments, the bottom S/D region 16 can be n-doped or p-doped. It should be noted that the source and drain can be interchangeable between the top and bottom locations of a vertical fin, where the doped region in the substrate 10 may act as a source or a drain. The bottom S/D region 16 can be formed before or after the formation of the fins 12.

Shallow trench isolation (STI) regions 18 are formed in trenches beside the bottom S/D region 16. The STI regions 18 are formed by depositing a dielectric material over the device and recessing the material by an etch back process (e.g., a selective wet or dry etch). A bottom spacer 20 can be formed on the bottom S/D region 16 on the substrate 10 and on the STI regions 18. The bottom spacer 20 may be an oxide, for example, silicon oxide (SiO), a nitride, for example, a silicon nitride (SiN), or an oxynitride, for example, silicon oxynitride (SiON), SiOC, SiOCN, SiCN, SiBCN, or any suitable combination of those materials. The thickness of the bottom spacer 20 may define a distance between the surface of the substrate to the start of a gate structure. The bottom spacer 20 can be formed using CVD, plasma enhanced CVD (PECVD), physical vapor deposition (PVD), etc.

Figure 2:
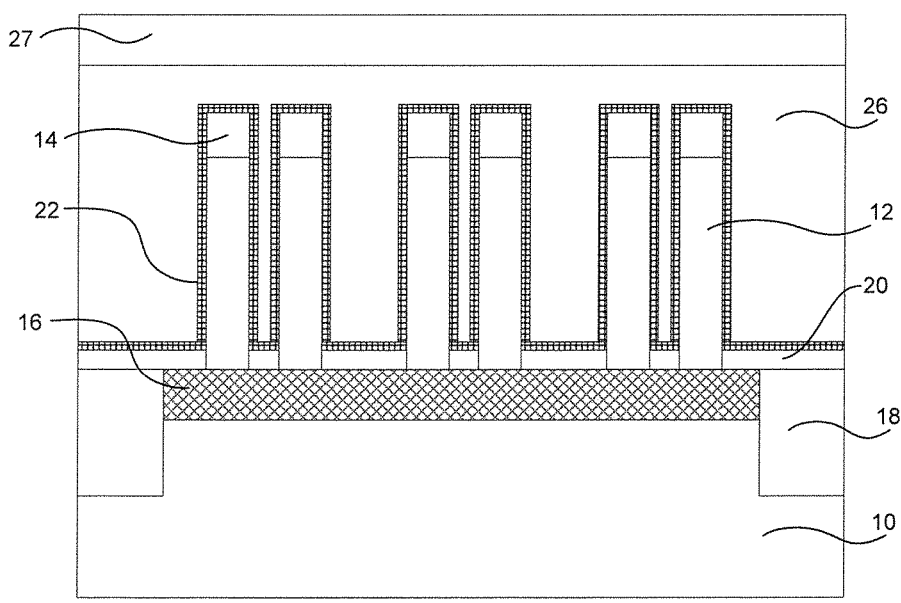
FIG. 2 is a cross-sectional view showing the semiconductor device of FIG. 1 after having a gate stack conformally deposited, a cutting mask deposited, and a resist layer deposited in accordance with an embodiment of the present invention.

Referring to FIG. 2, a gate stack 22 is conformally formed on the device. The gate stack 22 can include one or more gate dielectric layers, one or more gate conductor layers, one or more work function metal layers, etc. The gate dielectric layer can include a high-k dielectric layer or other dielectric layer (e.g., silicon oxide). The high-k dielectric layer may include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-k compounds may vary. In some embodiments, multiple layers of the gate dielectric can be employed.

One or more conductive layers are deposited and patterned to form the gate conductor layers. In various embodiments, a work function layer or other layers may be formed over the gate dielectric layer(s) that may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

The gate conductor layers can be formed on the work function layer, etc. or the gate dielectric layer. The gate conductor layer can be deposited by CVD, sputtering, PVD, or any suitable deposition process. The gate conductor layer includes conductive materials, such as, e.g., polycrystalline or amorphous silicon, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide) or any suitable combination of these materials. The conductive material may further comprise dopants that are incorporated during or after deposition.

In various embodiments, a cutting mask 26 is placed over at least a portion of the device. In one example, the cutting mask 26 is an organic planarization layer (OPL). The cutting mask 26 can be formed using a deposition process such as, for example, spin-on, CVD, PECVD, evaporation, chemical solution deposition and other like deposition techniques.

The thickness of the cutting mask 26 can vary so long as its thickness is greater than the total height of each fin. In one embodiment, the cutting mask 26 has a thickness from about 50 nm to about 500 nm. In another embodiment, the cutting mask 26 has a thickness from about 150 nm to about 300 nm.

In one embodiment, following the formation of the cutting mask 26, a photolithography and etch process sequence is applied. To provide the photoresist mask 28, a photoresist layer 27 is first positioned on the cutting mask 26. The photoresist layer 27 may be provided by a blanket layer of photoresist material that is formed utilizing a deposition process such as, for example, spin-on coating, etc. The blanket layer of photoresist material is then patterned to provide the photoresist mask 28 utilizing a lithographic process that may include exposing the photoresist material to a pattern of radiation and developing the exposed photoresist material utilizing a resist developer.

In one embodiment, the photoresist layer 27 can include a grey tone mask. The grey tone mask allows for variable light exposure through a non-uniform mask. The grey tone mask permits different amounts of light to penetrate through the mask in different regions, specifically, a mask providing "several" grey tones (referred to herein as a "grey tone mask"). "Several" herein refers to two or more than two. On a positive acting resist, the resist would be removed where hit by light and would remain where blocked out. In grey areas of the mask, different amounts of light would be transmitted, depending on the design of the mask; for example, some grey-tone regions might transmit 30% of the light whereas other grey-tone regions might transmit 60% of the light. The different percentages of light transmittal allow for multiple gate lengths with a single etch process, compared to two gate lengths with a photoresist mask. The typical spatial resolution of the grey tone mask is between 45-55 nm with the photoresist dependent depth resolution of about 10 nm.

Figure 3A:
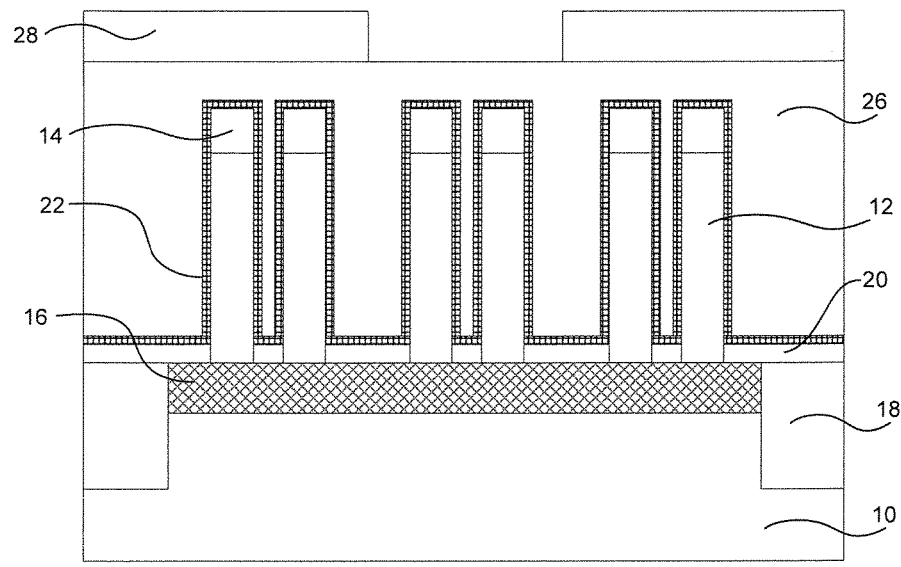
FIG. 3A is a cross-sectional view showing the semiconductor device of FIG. 2 after having a mask pattern in accordance with an embodiment of the present invention.

Referring to FIG. 3A, a mask is employed as the photoresist mask 28. The photoresist mask 28 is patterned to permit the center set of fins 12 to be a first length after an etch process and the right and left sets of fins 12 to be a second length after the etch process, allowing for two different gate lengths.

Figure 3B:
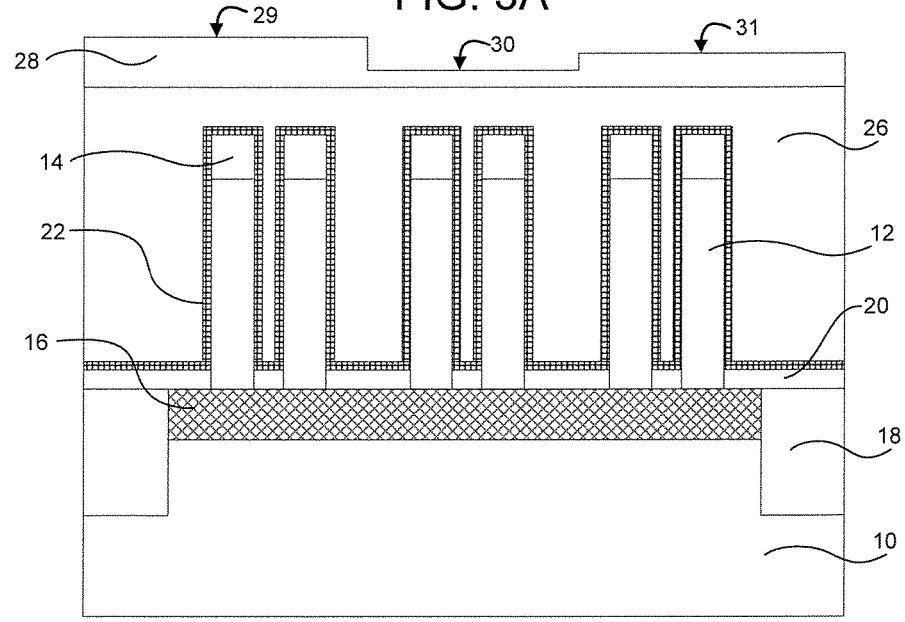
FIG. 3B is a cross-sectional view showing the semiconductor device of FIG. 2 after having a grey tone mask pattern in accordance with an embodiment of the present invention.

Referring to FIG. 3B, a grey tone mask is employed as the photoresist mask 28. The photoresist mask 28 is patterned to permit three different gate lengths. The left set of fins 12 will be etched with a first mask height 29, the center set of fins 12 will be etched with a second mask height 30, and the right set of fins 12 will be etched with a third mask height 31.

Figure 4A:
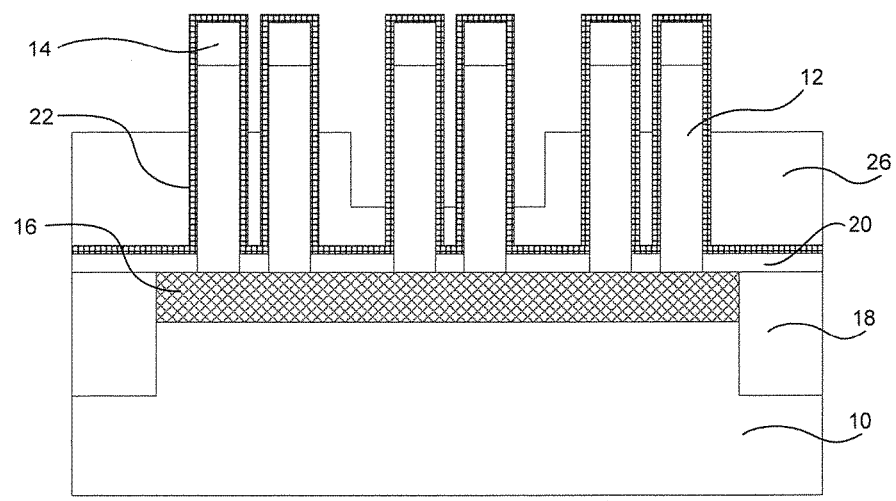
FIG. 4A is a cross-sectional view showing the semiconductor device of FIG. 3A after having the resist layer and the cutting mask removed in accordance with an embodiment of the present invention.

Referring to FIG. 4A, a non-selective etch process is performed. The non-selective etch process removes the photoresist mask 28 and etches back the cutting mask 26 to include the pattern in the photoresist mask 28. For example, the transferring of the pattern provided by the photoresist mask 28 into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point in the present invention include ion beam etching, plasma etching or laser ablation.

Figure 4B:
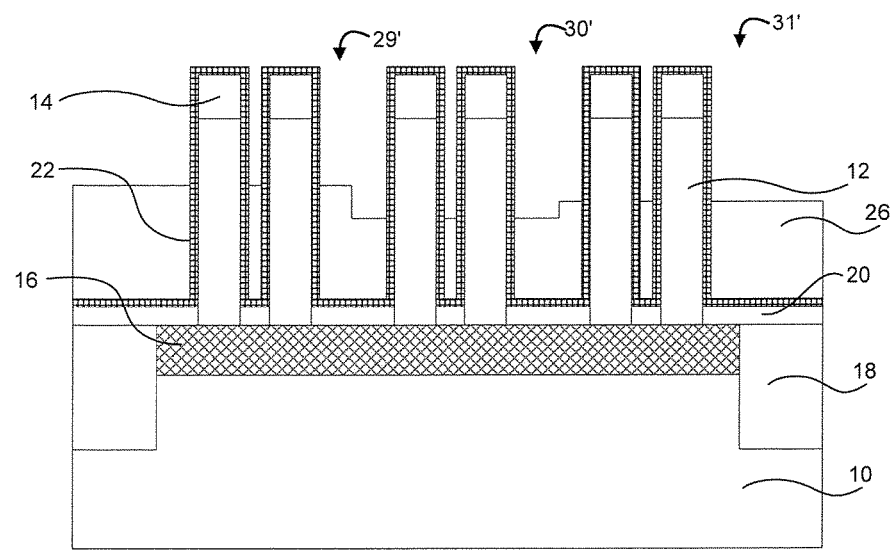
FIG. 4B is a cross-sectional view showing the semiconductor device of FIG. 3B after having the grey tone resist layer and the cutting mask removed in accordance with an embodiment of the present invention.

Referring to FIG. 4B, a non-selective etch process is performed. The non-selective etch process removes the photoresist mask 28 and etches back the cutting mask 26 to include the pattern in the photoresist mask 28. For example, the transferring of the pattern provided by the photoresist mask 28 into the underlying structures may include an anisotropic etch. The anisotropic etch may include reactive-ion etching (RIE). Other examples of anisotropic etching that can be used at this point in the present invention include ion beam etching, plasma etching or laser ablation.

The pattern transferred from the photoresist mask 28 allows the etch back of the cutting mask 26 layer to include three gate lengths. A left gate length 29' of the fins 12 on the left is longer than a right gate length 31' of the right fins 12, which is longer than a center gate length 30'. In one example, the minimum difference in the gate length is 10 nm with a lateral resolution of 50 nm. In another embodiment, more than three gates lengths are considered.

Figure 5A:
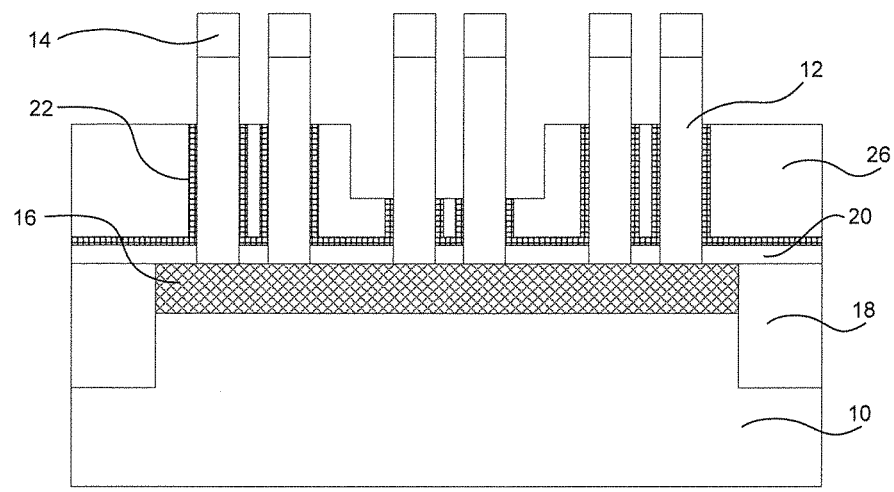
FIG. 5A is a cross-sectional view showing the semiconductor device of FIG. 4A after having the gate stack etched back to the height of the cutting mask in accordance with an embodiment of the present invention.
Figure 5B:
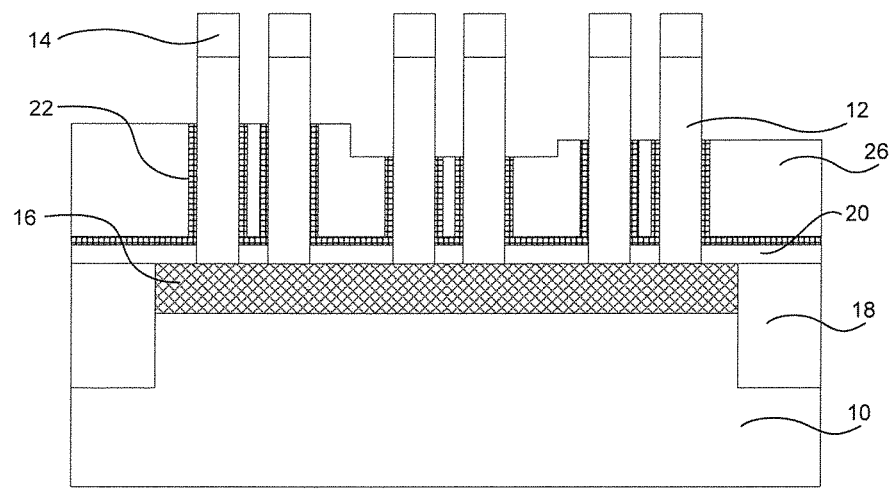
FIG. 5B is a cross-sectional view showing the semiconductor device of FIG. 4B after having the gate stack etched back to the height of the cutting mask in accordance with an embodiment of the present invention.

Referring to FIGS. 5A and 5B, a selective etch (wet or dry) is performed to remove the gate stack 22 to the top surface of the cutting mask 26. As used herein, the term "selective" in reference to a material removal process denotes that the rate of material removal for a first material is greater than the rate of removal for at least another material of the structure to which the material removal process is being applied.

Figure 6A:
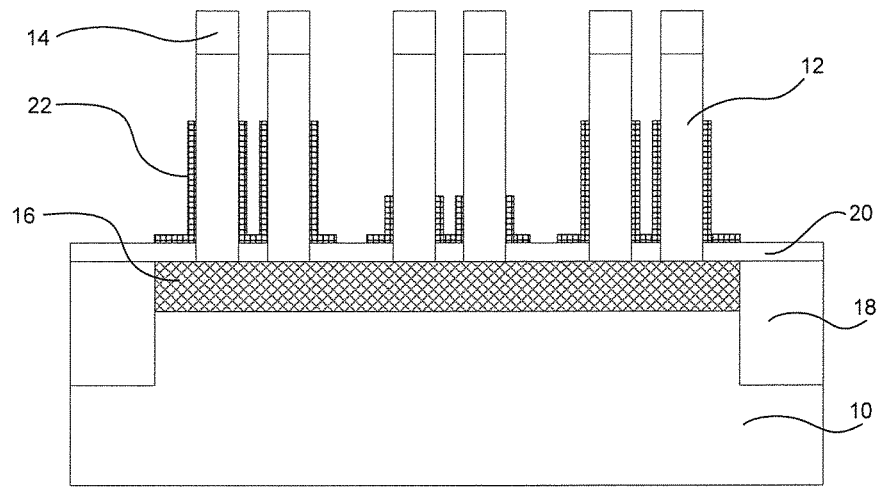
FIG. 6A is a cross-sectional view showing the semiconductor device of FIG. 5A after having the cutting mask and the gate stack between the sets of fins removed in accordance with an embodiment of the present invention.
Figure 6B:
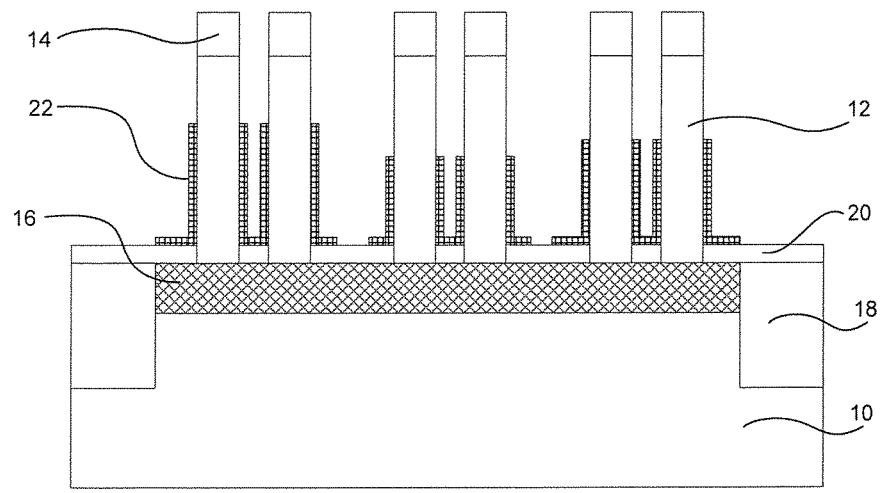
FIG. 6B is a cross-sectional view showing the semiconductor device of FIG. 5B after having the cutting mask and the gate stack between the sets of fins removed in accordance with an embodiment of the present invention.

Referring to FIGS. 6A and 6B, a selective etch (wet or dry) is performed to remove the remainder of the cutting mask 26. The gate stack 22 between the sets of fins is removed with a lithography and etching process. The lithographic step can include forming a photoresist (not shown) atop a device, exposing the photoresist to a desired pattern of radiation and then developing the exposed photoresist utilizing a resist developer. The pattern within the photoresist is then transferred onto the device. The etch can include a dry etch process, a chemical wet etch process, or any combination thereof. When a dry etch is used, the dry etch can be a reactive ion etch process, a plasma etch process, or ion beam etching. The patterned photoresist material can be removed after transferring the pattern utilizing a stripping process.

Figure 7A:
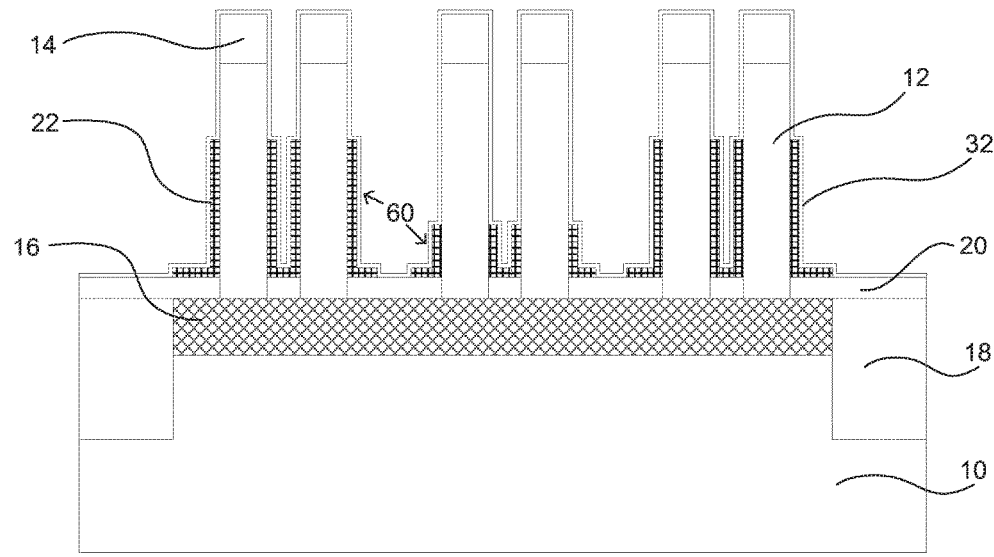
FIG. 7A is a cross-sectional view showing the semiconductor device of FIG. 6A after having a spacer deposited in accordance with an embodiment of the present invention.
Figure 7B:
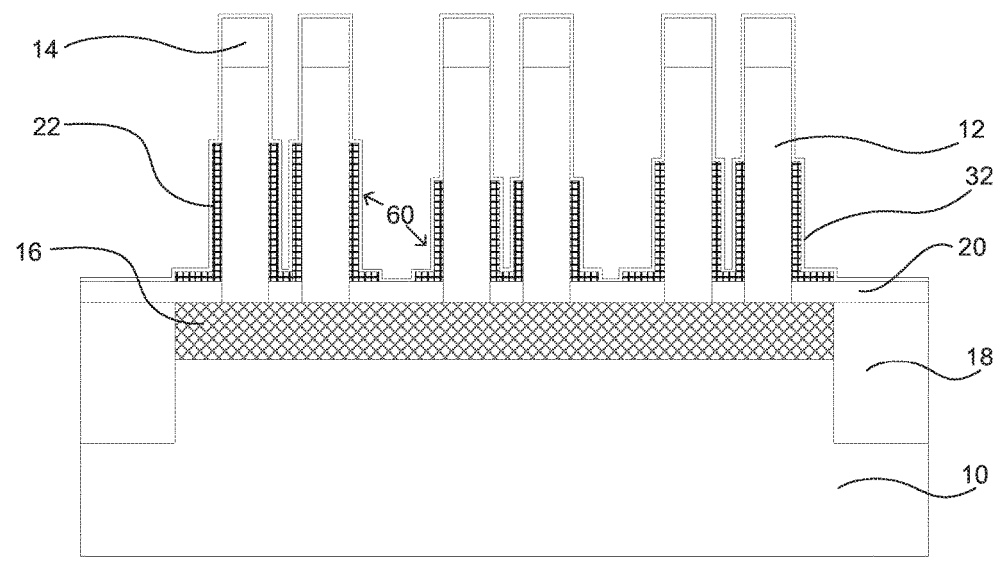
FIG. 7B is a cross-sectional view showing the semiconductor device of FIG. 6B after a having spacer deposited in accordance with an embodiment of the present invention.

Referring to FIGS. 7A and 7B, a conformal spacer 32 is deposited on the device. The conformal spacer 32 can be formed on gate structures 60 (e.g., gate stack 22 and fins 12). The conformal spacer 32 may be an oxide, for example, silicon oxide (SiO), a nitride, for example, a silicon nitride (SiN), or an oxynitride, for example, silicon oxynitride (SiON), SiOC, SiOCN, SiCN, SiBCN, or any suitable combination of those materials. The conformal spacer 32 can be formed using CVD, PECVD, PVD, etc.

Figure 8A:
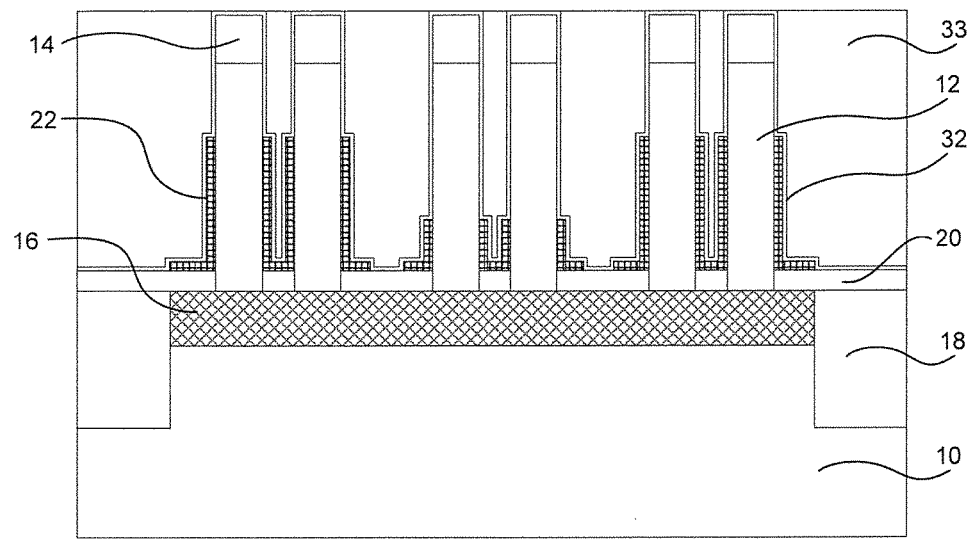
FIG. 8A is a cross-sectional view showing the semiconductor device of FIG. 7A after having an interlevel dielectric (ILD) material deposited and planarized with the spacer in accordance with an embodiment of the present invention.
Figure 8B:
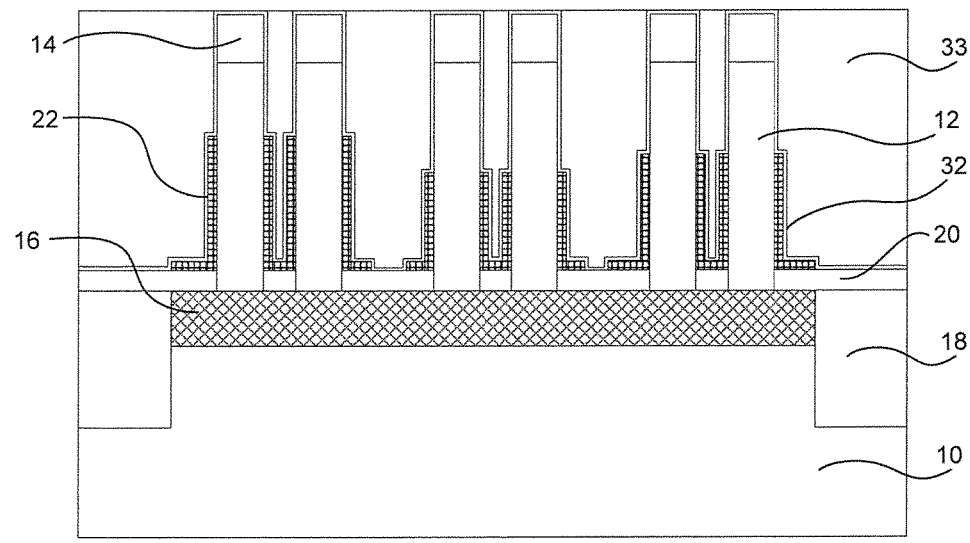
FIG. 8B is a cross-sectional view showing the semiconductor device of FIG. 7B after having an ILD material deposited and planarized with the spacer in accordance with an embodiment of the present invention.

Referring to FIGS. 8A and 8B, an interlevel dielectric (ILD) 33 is formed and planarized (via, e.g., CMP) to the conformal spacer 32. The ILD 33 can include an oxide or other dielectric material(s).

Figure 9A:
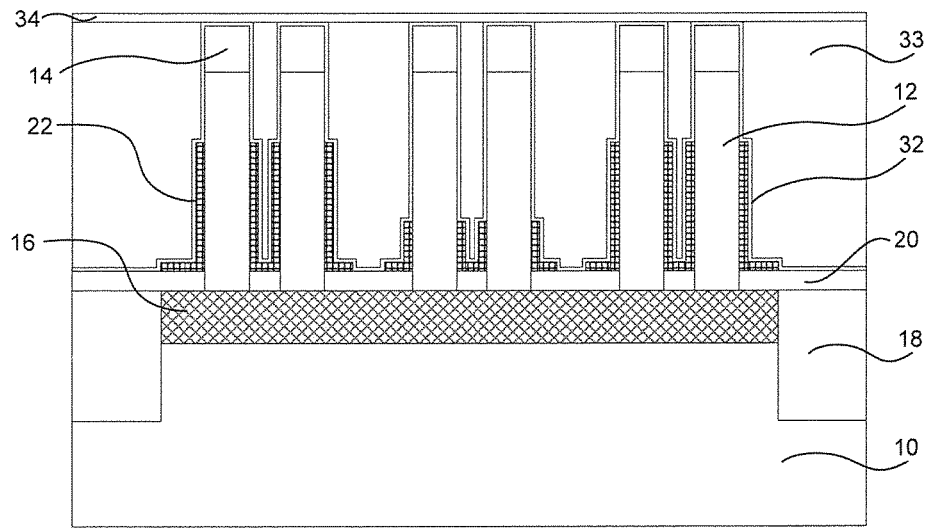
FIG. 9A is a cross-sectional view showing the semiconductor device of FIG. 8A having after a liner deposited in accordance with an embodiment of the present invention.
Figure 9B:
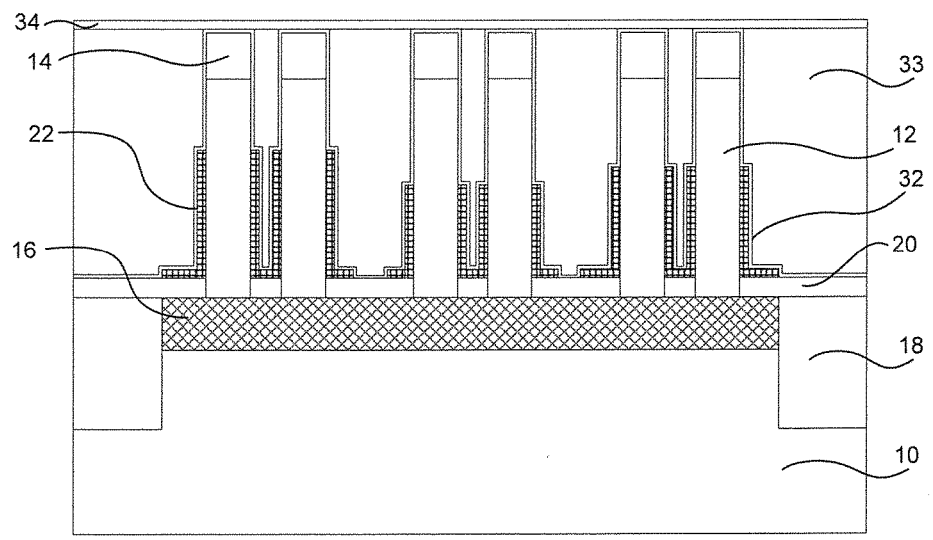
FIG. 9B is a cross-sectional view showing the semiconductor device of FIG. 8B after having a liner deposited in accordance with an embodiment of the present invention.

Referring to FIGS. 9A and 9B, a top liner 34 is deposited on the device. The top liner 34 can be formed on the conformal spacer 32 and the ILD 33. The top liner 34 can be an oxide, for example, silicon oxide (SiO), a nitride, for example, a silicon nitride (SiN), or an oxynitride, for example, silicon oxynitride (SiON), SiOC, SiOCN, SiCN, SiBCN, or any suitable combination of those materials. The top liner 34 can be formed using CVD, PECVD, PVD, etc.

Figure 10A:
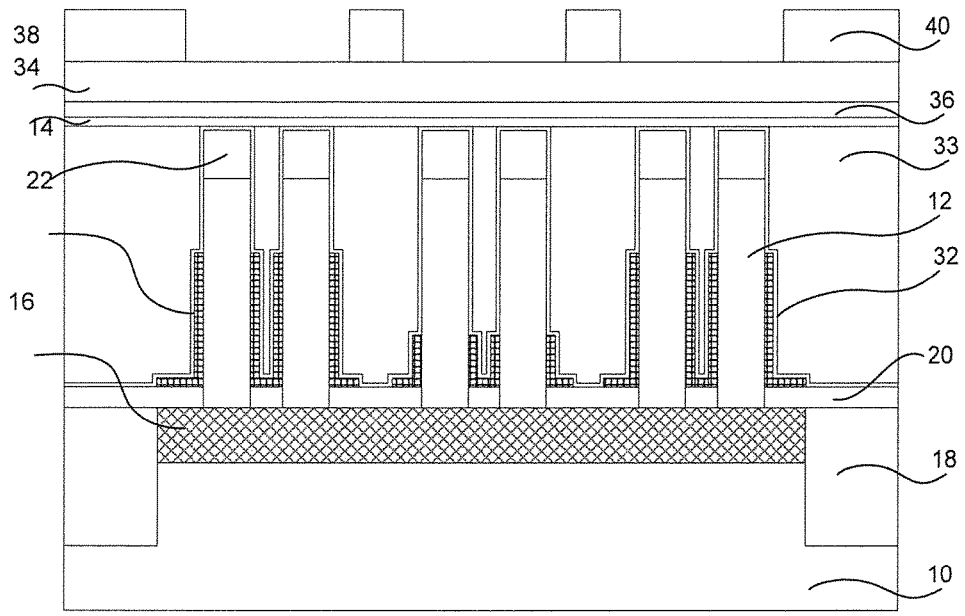
FIG. 10A is a cross-sectional view showing the semiconductor device of FIG. 9A after having a mask deposited and patterned in accordance with an embodiment of the present invention.
Figure 10B:
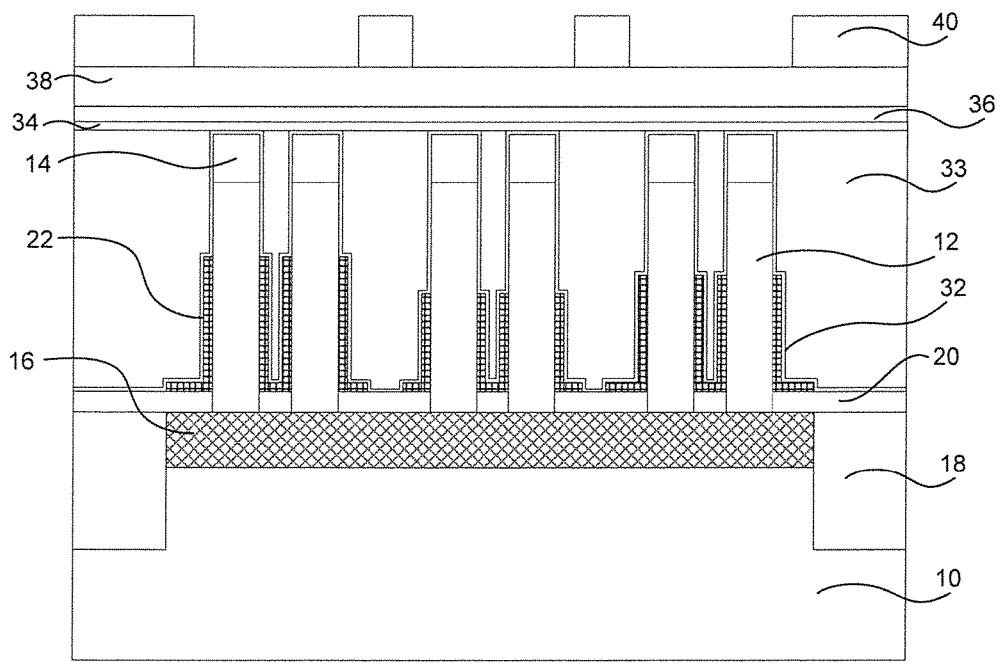
FIG. 10B is a cross-sectional view showing the semiconductor device of FIG. 9B after having a mask deposited and patterned in accordance with an embodiment of the present invention.

Referring to FIGS. 10A and 10B, a hard mask 36 can include an oxide such as, e.g., silicon dioxide or a nitride such as, e.g. silicon nitride, which is deposited on the top liner 34. A cutting mask 38 is placed over the hard mask 36. In one example, the cutting mask 38 is an organic planarization layer (OPL). A patterned photoresist mask 40 is formed over the cutting mask 38.

Figure 11A:
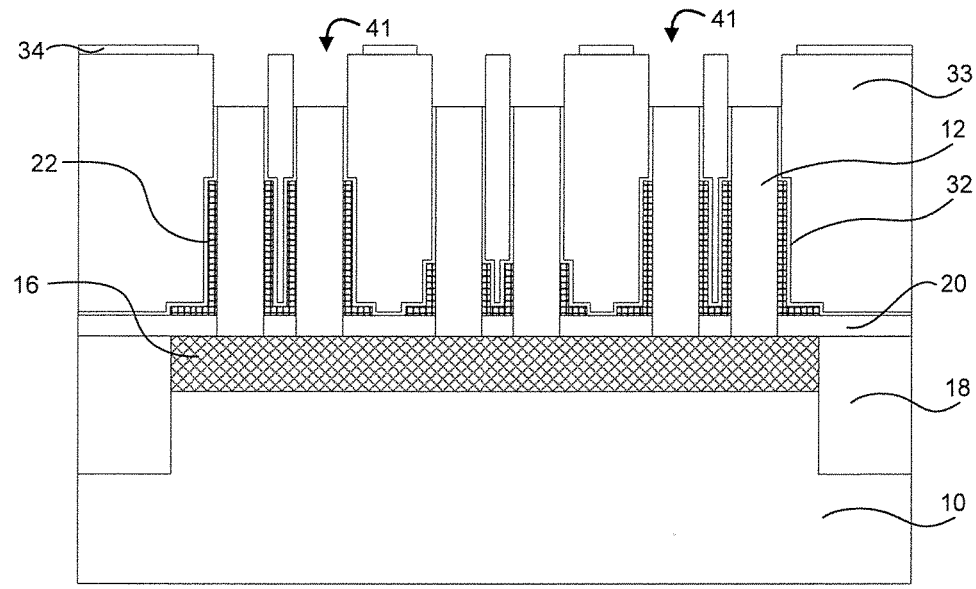
FIG. 11A is a cross-sectional view showing the semiconductor device of FIG. 10A after having the mask, the liner, the spacer, and the hard mask cap removed in accordance with an embodiment of the present invention.
Figure 11B:
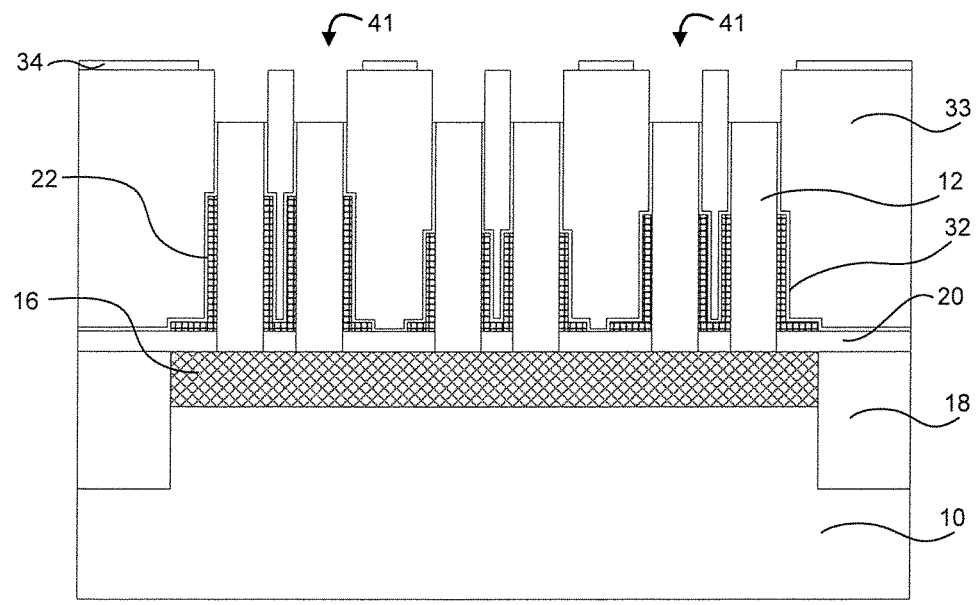
FIG. 11B is a cross-sectional view showing the semiconductor device of FIG. 10B after having the mask, the liner, the spacer, and the hard mask cap removed in accordance with an embodiment of the present invention.

Referring to FIGS. 11A and 11B, a photolithography and etch process sequence is applied. The hard mask 36, the cutting mask 38, and the photoresist mask 40 are consumed or removed during the process. The process removes the hard mask cap 14, the conformal spacer 32 directly adjacent to the hard mask cap 14, and the top liner 34 under the pattern. This process produces trenches over the fins that are relatively the same depth. In an alternate embodiment (not shown), multiple masked etches are performed to remove the hard mask cap 14 and the top liner 34 under the pattern. The process also removes the fin 12 and the conformal spacer 32 down to the gate. This process produces trenches over the fins that vary in depth based on the gate length for the fin.

Figure 12A:
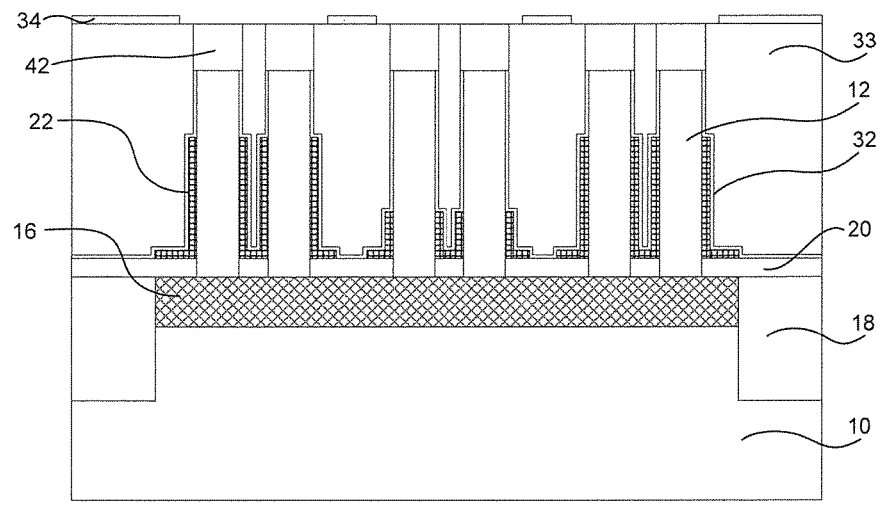
FIG. 12A is a cross-sectional view showing the semiconductor device of FIG. 11A after having epitaxial growth on the fins in accordance with an embodiment of the present invention.
Figure 12B:
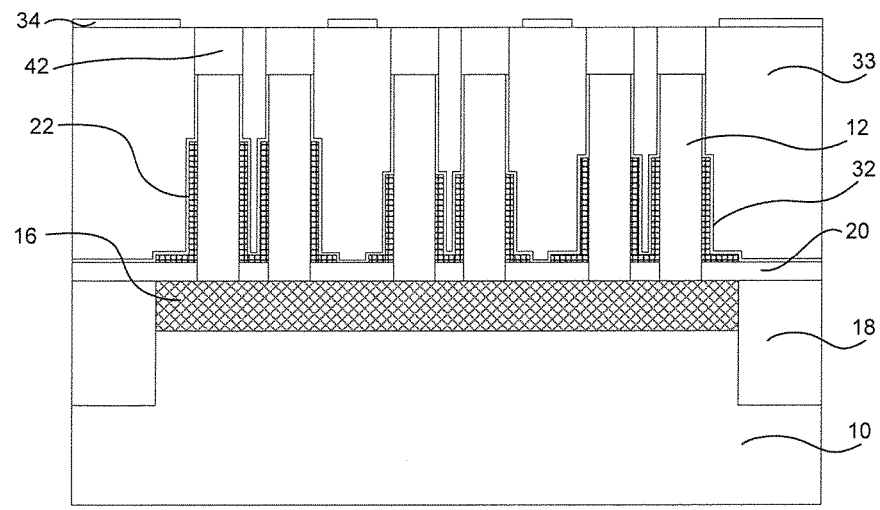
FIG. 12B is a cross-sectional view showing the semiconductor device of FIG. 11B after having epitaxial growth on the fins in accordance with an embodiment of the present invention.

Referring to FIGS. 12A and 12B, a top source/drain (S/D) region 42 can be epitaxially grown on the fins 12. The top S/D region 42 can be formed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ $cm^{-3}$ to about $2\times10^{21}$ $cm^{-3}$, or preferably between $2\times10^{20}$ $cm^{-3}$ and $1\times10^{21}$ $cm^{-3}$.

Figure 13A:
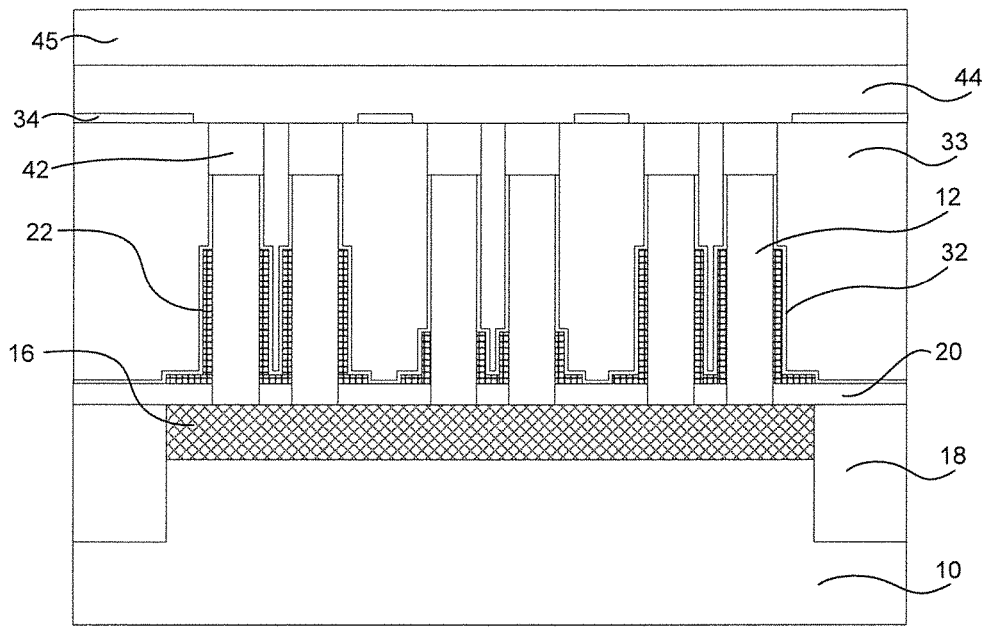
FIG. 13A is a cross-sectional view showing the semiconductor device of FIG. 12A after having a cutting mask and a resist layer deposited in accordance with an embodiment of the present invention.
Figure 13B:
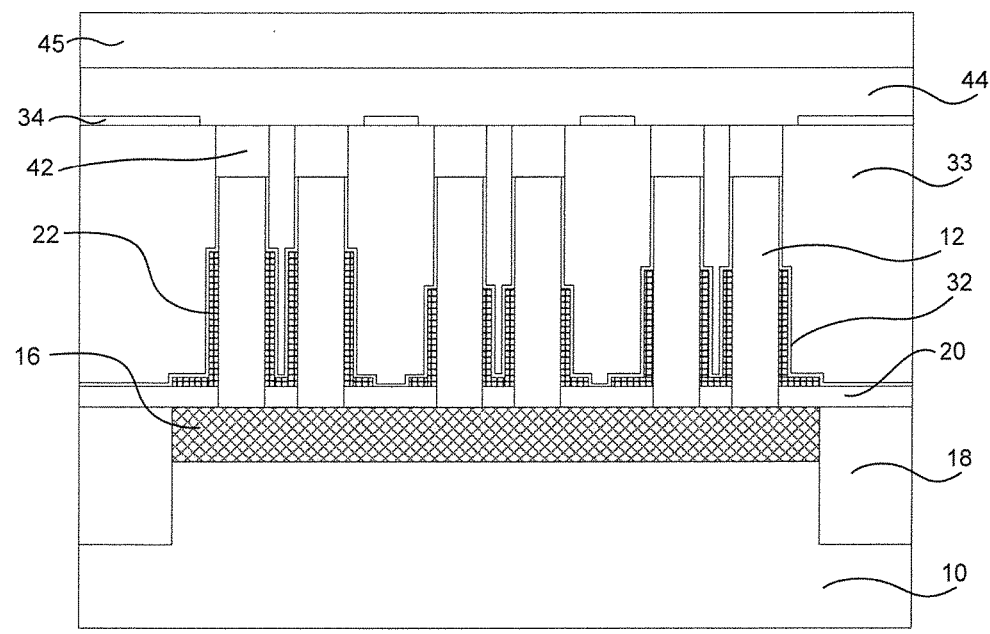
FIG. 13B is a cross-sectional view showing the semiconductor device of FIG. 12B after having a cutting mask and a resist layer deposited in accordance with an embodiment of the present invention.

Referring to FIGS. 13A and 13B, a cutting mask 44 is placed over a portion of the device. In one example, the cutting mask 44 is an organic planarization layer (OPL). The cutting mask 44 can be formed utilizing a deposition process such as, for example, spin-on, CVD, PECVD, evaporation, chemical solution deposition and other like deposition techniques.

The thickness of the cutting mask 44 can vary so long as its thickness is greater than the height of the top liner 34. In one embodiment, the cutting mask 44 has a thickness from about 50 nm to about 500 nm. In another embodiment, the cutting mask 44 has a thickness from about 150 nm to about 300 nm.

In one embodiment, following the formation of the cutting mask 44, a photolithography and etch process sequence is applied. To provide the photoresist mask 46, a photoresist layer 45 is first positioned on the cutting mask 44. The photoresist layer 45 may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask 46 utilizing a lithographic process that may include exposing the photoresist material to a pattern of radiation and developing the exposed photoresist material utilizing a resist developer.

In one embodiment, the photoresist layer 45 can include a grey tone mask. The grey tone mask allows for variable light exposure through a non-uniform mask. The grey tone mask allows different amounts of light to penetrate through the mask in different regions, specifically, a mask providing "several" grey tones (referred to herein as a "grey tone mask"). "Several" herein refers to two or more than two. On a positive acting resist, the resist would be removed where hit by light and would remain where blocked out. In grey areas of the mask, different amounts of light would be transmitted, depending on the design of the mask; for example, some grey tone regions might transmit 30% of the light whereas other grey tone regions might transmit 60% of the light. The different percentages of light transmittal allow for multiple gate lengths with a single etch process, compared to two gate lengths with a mask. The typical spatial resolution of the grey tone mask is between 45-55 nm with the photoresist dependent depth resolution of about 10 nm.

Figure 14A:
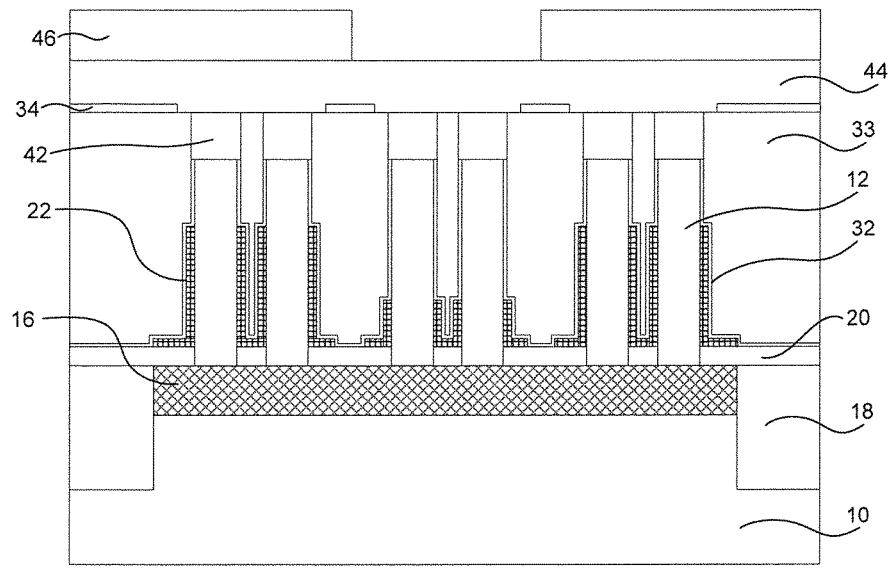
FIG. 14A is a cross-sectional view showing the semiconductor device of FIG. 13A after having a mask pattern in accordance with an embodiment of the present invention.

Referring to FIG. 14A, a mask is employed as the photoresist mask 46. The photoresist mask 46 is patterned to permit implantation in the center set of fins 12 to be a first depth and implantation in the right and left sets of fins 12 to be a second depth, allowing for two different gate lengths.

Figure 14B:
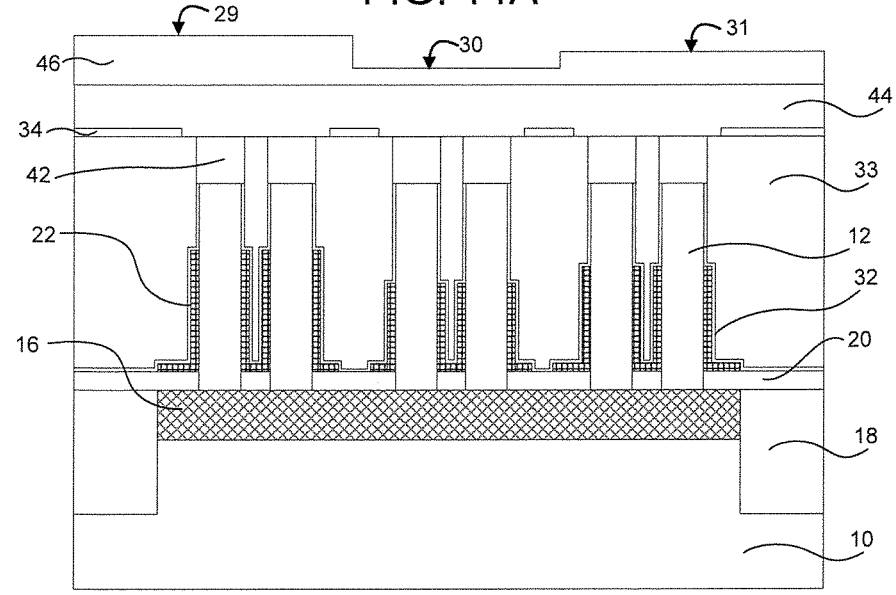
FIG. 14B is a cross-sectional view showing the semiconductor device of FIG. 13B after having a grey tone mask pattern in accordance with an embodiment of the present invention.

Referring to FIG. 14B, a grey tone mask is employed as the photoresist mask 46. The photoresist mask 46 is patterned to permit three different implantation depths. The left set of fins 12 will be implanted to a first mask height 29, the center set of fins 12 will be implanted to a second mask height 30, and the right set of fins 12 will be implanted to a third mask height 31.

Figure 15A:
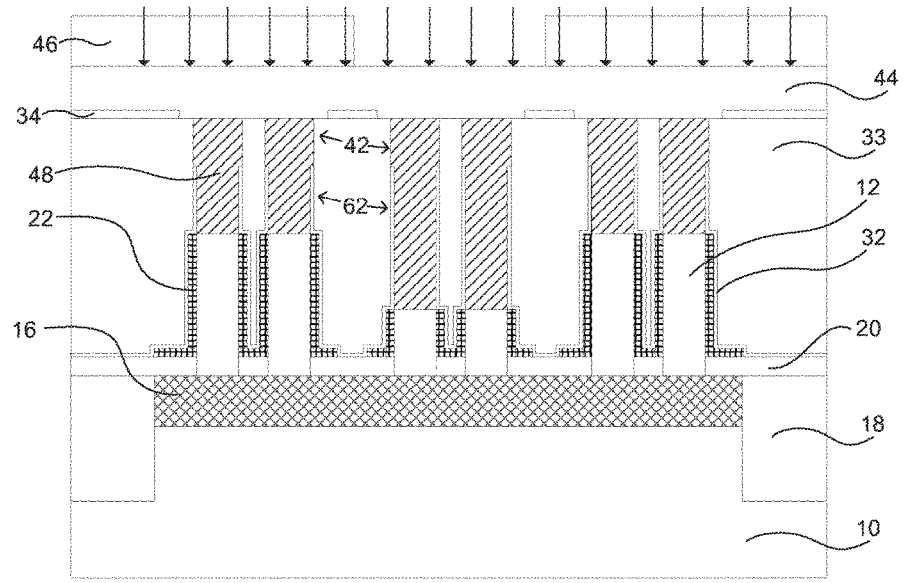
FIG. 15A is a cross-sectional view showing the semiconductor device of FIG. 14A after having implantation of dopants in accordance with an embodiment of the present invention.

Referring to FIG. 15A, the top S/D region 42 will form a top doped S/D region 48 including the top source/drain region 42 and a top source/drain extension region 62 after an ion implantation process. The ion implantation process forms the top doped S/D region 48 by implanting into the fin 12 down to the gate based on the different mask heights in the photoresist mask 46. The center set of fins 12 will be implanted a first height and the right and left sets of fins 12 will be implanted to a second height, forming two different gate lengths.

Figure 15B:
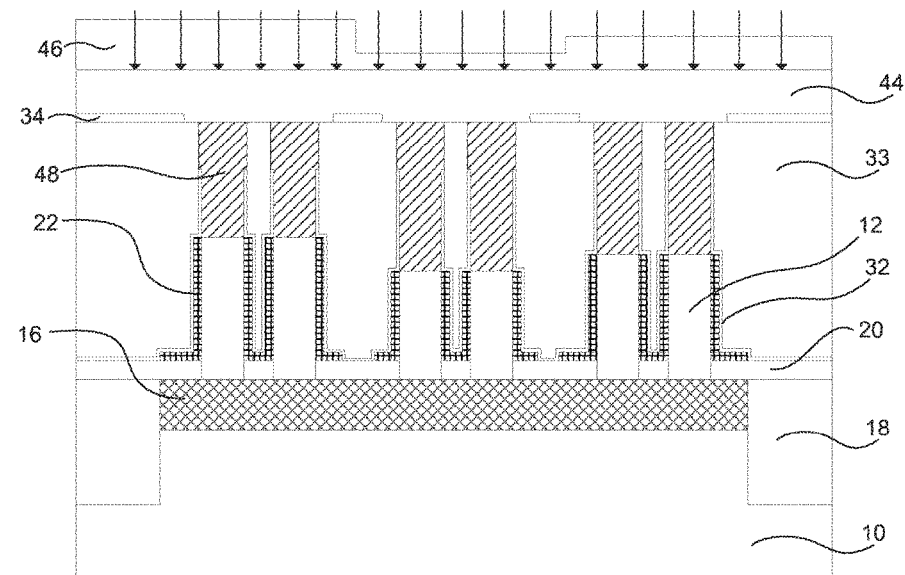
FIG. 15B is a cross-sectional view showing the semiconductor device of FIG. 14B after having implantation of dopants in accordance with an embodiment of the present invention.

Referring to FIG. 15B, the top S/D region 42 will form a top doped S/D region 48 after an ion implantation process. The ion implantation process forms the top doped S/D region 48 by implanting into the fins 12 down to the gate based on the different mask heights in the photoresist mask 46. The left set of fins 12 will be implanted to a first mask height, the center set of fins 12 will be implanted to a second mask height, and the right set of fins 12 will be implanted to a third mask height, forming the top doped S/D region 48 being three different heights. In another embodiment, more than three gate lengths and top doped S/D region heights are formed.

Figure 16A:
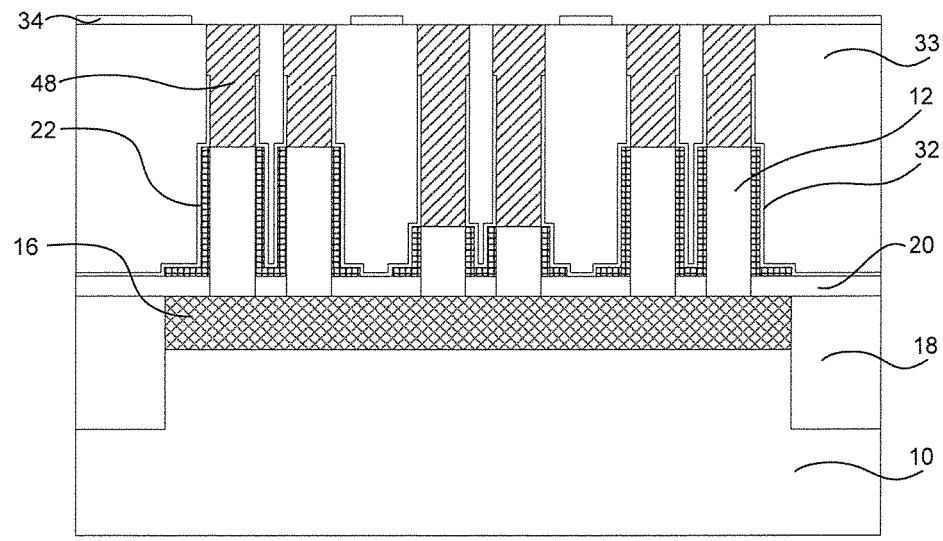
FIG. 16A is a cross-sectional view showing the semiconductor device of FIG. 15A after having the resist layer and the cutting mask removed in accordance with an embodiment of the present invention.

Referring to FIG. 16A, a non-selective etch process is performed to form a two length gate semiconductor device. The non-selective etch process will remove the photoresist mask 46 and etch mask 46. Processing can continue with the formation of contacts and other back end of the line (BEOL) processing.

Figure 16B:
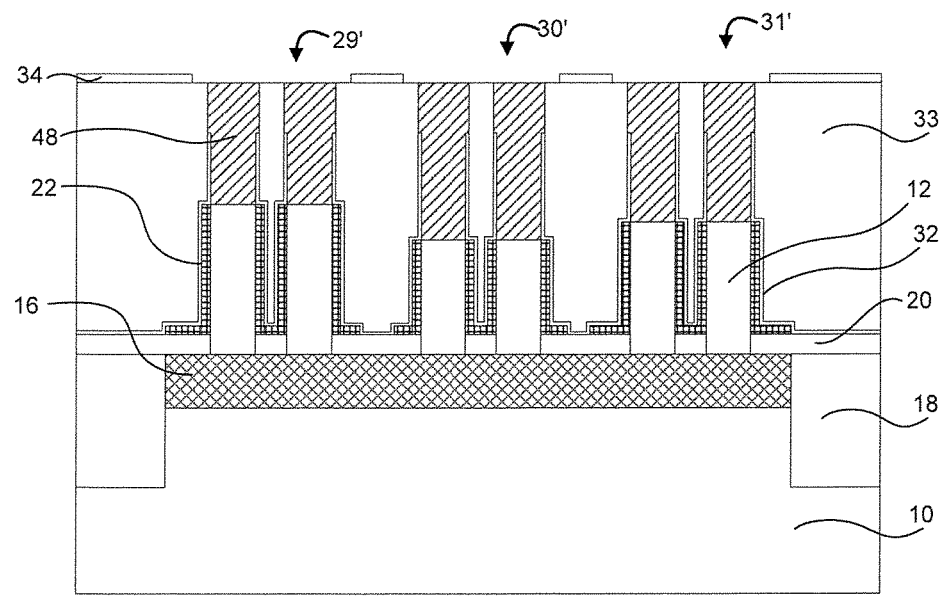
FIG. 16B is a cross-sectional view showing the semiconductor device of FIG. 15B after having the grey tone resist layer and the cutting mask removed in accordance with an embodiment of the present invention.

Referring to FIG. 16B, a non-selective etch process is performed to form a multilength gate semiconductor device. The non-selective etch process will remove the photoresist mask 46 and etch mask 46. Processing can continue with the formation of contacts and other back end of the line (BEOL) processing.

Figure 17A:
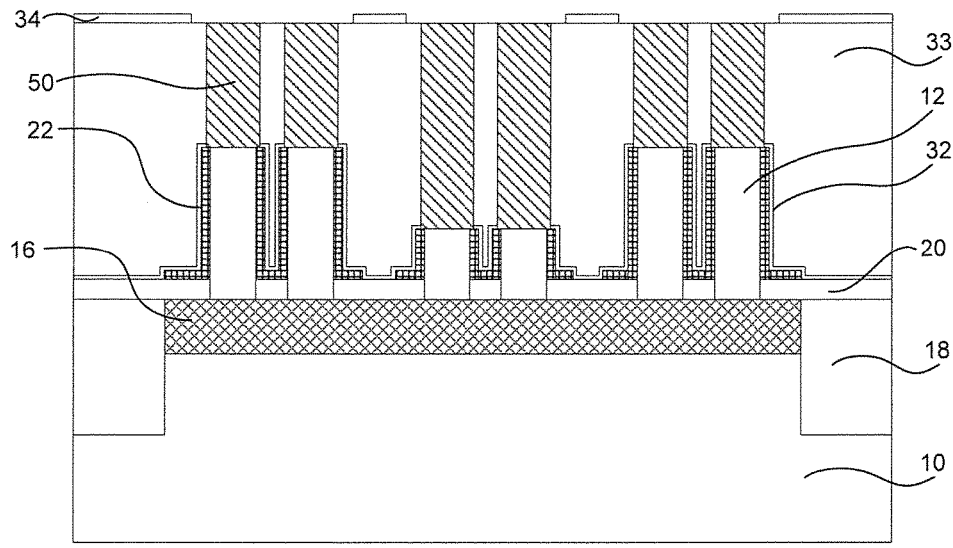
FIG. 17A is a cross-sectional view showing a semiconductor device in accordance with an embodiment of the present invention.
Figure 17B:
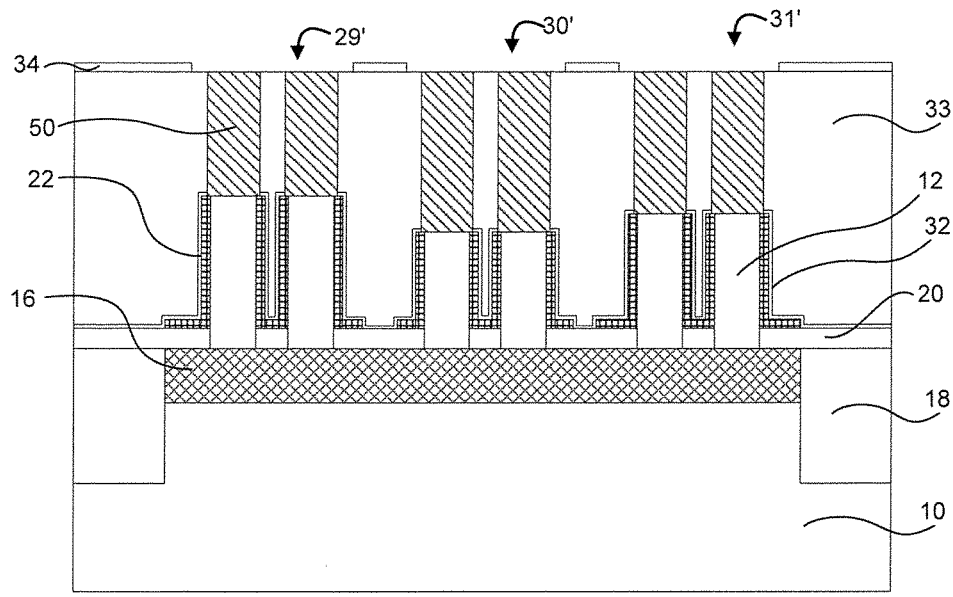
FIG. 17B is a cross-sectional view showing a semiconductor device in accordance with an embodiment of the present invention.

Referring to FIGS. 17A and 17B, in another embodiment, multiple masked etches are performed to remove a hard mask cap and a top liner. The process also removes the fin and the conformal spacer down to the gate. This process produces trenches over the fins that vary in depth based on the gate length for the fin. In one embodiment, the trenches are two heights in FIG. 17A. In another embodiment, the trenches are three heights in FIG. 17B with the trenches over the left set of fins 12 having the left gate length 29', the trench of the center set of fins 12 having the center gate length 30', and the trench over the right set of fins having the right gate length 31'.

A top S/D region 50 can be epitaxially grown on the fins 12 in the trenches forming a multilength gate semiconductor device. The top S/D region 50 will have different heights based on the depth of the trenches over the fins. The top S/D region 50 can be formed process previously described. Processing can continue with the formation of contacts and other back end of the line (BEOL) processing.

Having described preferred embodiments of a VTFET with two or more gate lengths and a method for producing the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a device with multiple gate lengths, comprising:
   forming a gate stack on vertical fins with a bottom source/drain region on a substrate;
   forming a photoresist mask on the gate stack to accommodate two gate lengths;
   etching a cutting mask formed on the photoresist mask to include two different heights;
   etching the gate stack to form gate structures with the two gate lengths by employing the two different heights in the cutting mask as an etch mask;
   removing the cutting mask; and
   forming a top source/drain region on top of the vertical fins.

2. The method as recited in claim 1, wherein heights of the gate structures combined with heights of the top source/drain region on the vertical fins are equal between all the vertical fins.

3. The method as recited in claim 1, wherein the gate stack that includes a gate dielectric layer and a work function metal layer.

4. The method as recited in claim 1, wherein the photoresist mask includes a grey tone photoresist mask.

5. The method as recited in claim 1, wherein forming the top source/drain region includes epitaxially growing the top source/drain region to different depths in trenches on the vertical fins.

6. The method as recited in claim 5, wherein forming the top source/drain region further includes forming a top resist mask patterned to accommodate two or more implantation depths, etching a top cutting mask using the pattern in the top resist mask, and forming a top source/drain extension region.

7. The method as recited in claim 6, wherein forming the top source/drain extension region includes performing an ion implantation process into the vertical fins down to the gate structure by employing the top mask.

8. A method for forming a device with multiple gate lengths, comprising:
- forming a cutting mask over a conformal gate stack on vertical fins with a bottom source/drain region on a substrate;
- forming a resist layer over the cutting mask;
- forming a resist mask by patterning the resist layer to accommodate two gate lengths;
- etching the cutting mask below using the pattern in the resist mask to include two different heights in the cutting mask;
- forming gate structures with the two gate lengths employing the two different heights in the cutting mask to etch back the conformal gate stack to the two gate lengths;
- removing the cutting mask;
- forming a spacer and an etch mask;
- patterning the etch mask to expose the vertical fins;
- forming trenches to different depths accommodated by the etch mask by etching the spacer, a hard mask on vertical fins of the gate structures, and the vertical fins of the gate structures; and
- forming a top source/drain region in the trenches on the gate structures.

9. The method as recited in claim 8, wherein heights of the gate structures combined with heights of the top source/drain region on the gate structure are equal between all the gate structures.

10. The method as recited in claim 8, wherein the conformal gate stack that includes a gate dielectric layer and a work function metal layer.

11. The method as recited in claim 8, wherein patterning the resist layer includes forming a photoresist mask to accommodate at least two of gate lengths.

12. The method as recited in claim 11, wherein the photoresist mask includes a grey tone photoresist mask.

13. The method as recited in claim 8, wherein forming the top source/drain region includes epitaxially growing the top source/drain region in the trenches until the top source/drain regions have the different depths accommodated by the etch mask.

* * * * *